US012658894B2

(12) United States Patent
Nagahara et al.

(10) Patent No.: US 12,658,894 B2
(45) Date of Patent: Jun. 16, 2026

(54) SEMICONDUCTOR DEVICE

(71) Applicant: Mitsubishi Electric Corporation,
Tokyo (JP)

(72) Inventors: Teruaki Nagahara, Tokyo (JP);
Kosuke Yamaguchi, Tokyo (JP)

(73) Assignee: Mitsubishi Electric Corporation,
Tokyo (JP)

( * ) Notice: Subject to any disclaimer, the term of this
patent is extended or adjusted under 35
U.S.C. 154(b) by 70 days.

(21) Appl. No.: 18/659,670

(22) Filed: May 9, 2024

(65) Prior Publication Data

US 2025/0038737 A1      Jan. 30, 2025

(30) Foreign Application Priority Data

Jul. 25, 2023      (JP) ................................. 2023-120388

(51) Int. Cl.
| | |
|---|---|
| *H03K 3/011* | (2006.01) |
| *H02P 27/06* | (2006.01) |
| *H03K 17/567* | (2006.01) |
| *H03K 17/687* | (2006.01) |
| *H10W 70/40* | (2026.01) |
| *H10W 74/10* | (2026.01) |
| *H10W 90/00* | (2026.01) |

(52) U.S. Cl.
CPC ........... *H03K 3/011* (2013.01); *H03K 17/567*
(2013.01); *H03K 17/687* (2013.01); *H02P*
*27/06* (2013.01); *H10W 70/465* (2026.01);

*H10W 70/481* (2026.01); *H10W 74/111*
(2026.01); *H10W 90/811* (2026.01)

(58) Field of Classification Search
CPC ...... H03K 17/122; H03K 17/12; H03K 17/00;
H03K 17/567; H03K 2217/0036; H03K
2217/00; H03K 17/687; H03K 17/56;
H03K 17/51
See application file for complete search history.

(56) References Cited

U.S. PATENT DOCUMENTS 10,644,689 B2 *   5/2020   Shinomiya ............. H03K 17/06

FOREIGN PATENT DOCUMENTS

JP            6544316 B2      7/2019

* cited by examiner

*Primary Examiner* — Diana J. Cheng
(74) *Attorney, Agent, or Firm* — Studebaker Brackett
PLLC

(57) ABSTRACT

An object is to provide a technique that suppresses heat
generation in a first semiconductor switching element and a
second semiconductor switching element. A semiconductor
device includes a gate drive circuit that drives each of the
first semiconductor switching element and the second semi-
conductor switching element based on an input signal. When
a first gate voltage applied to the first gate to turn On the first
semiconductor switching element is lower than a first thresh-
old, the gate drive circuit turns Off the first semiconductor
switching element after turns Off the second semiconductor
switching element regardless of the input signal.

18 Claims, 18 Drawing Sheets

F I G. 1
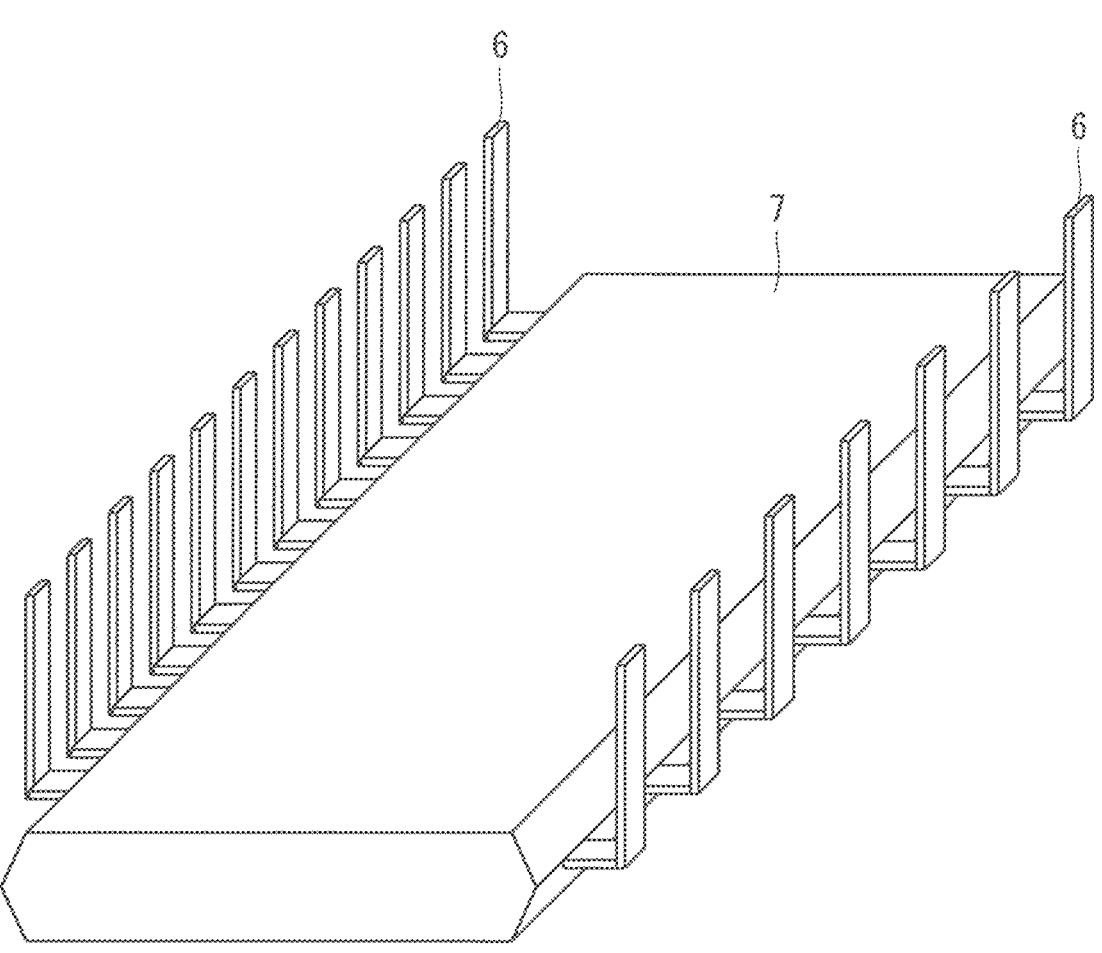

F I G. 3
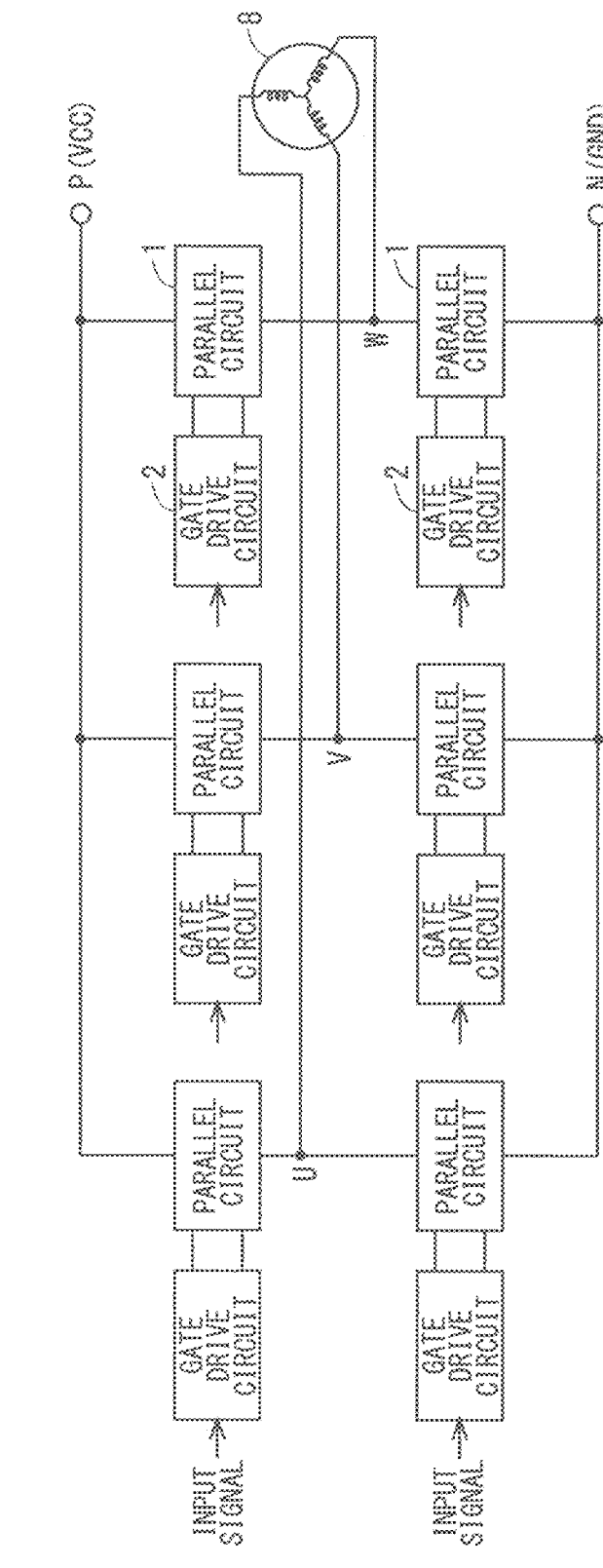

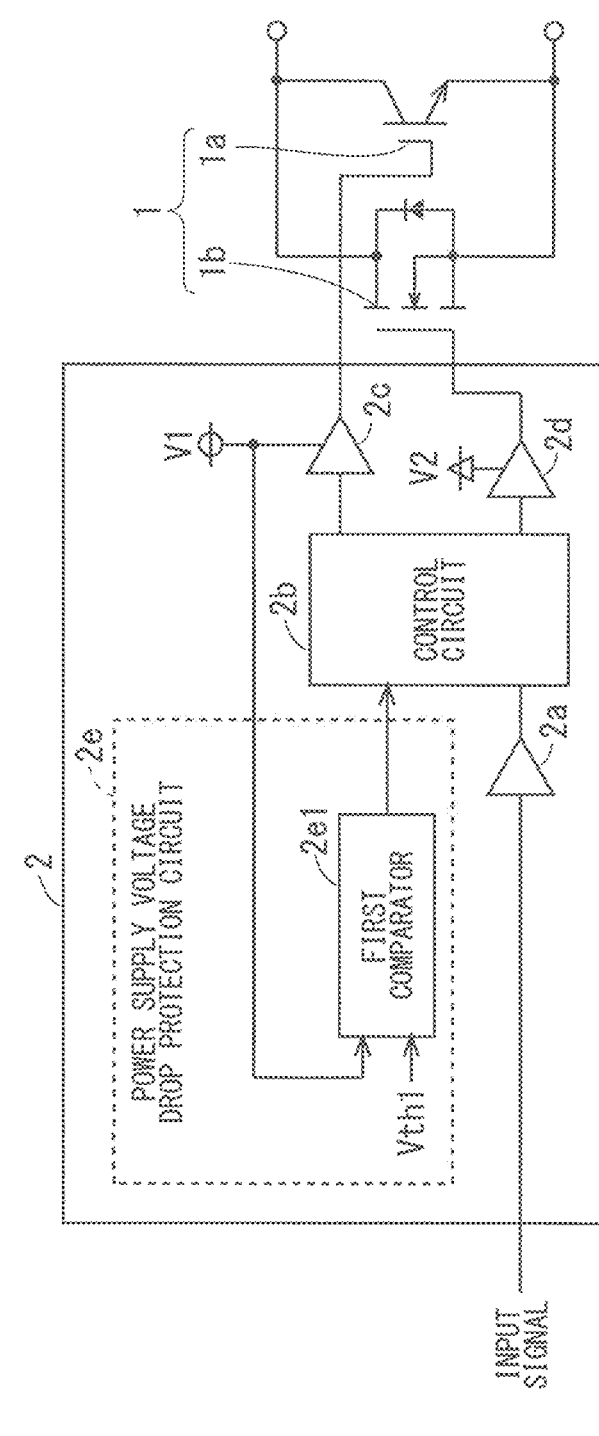
F I G. 4

F I G. 5
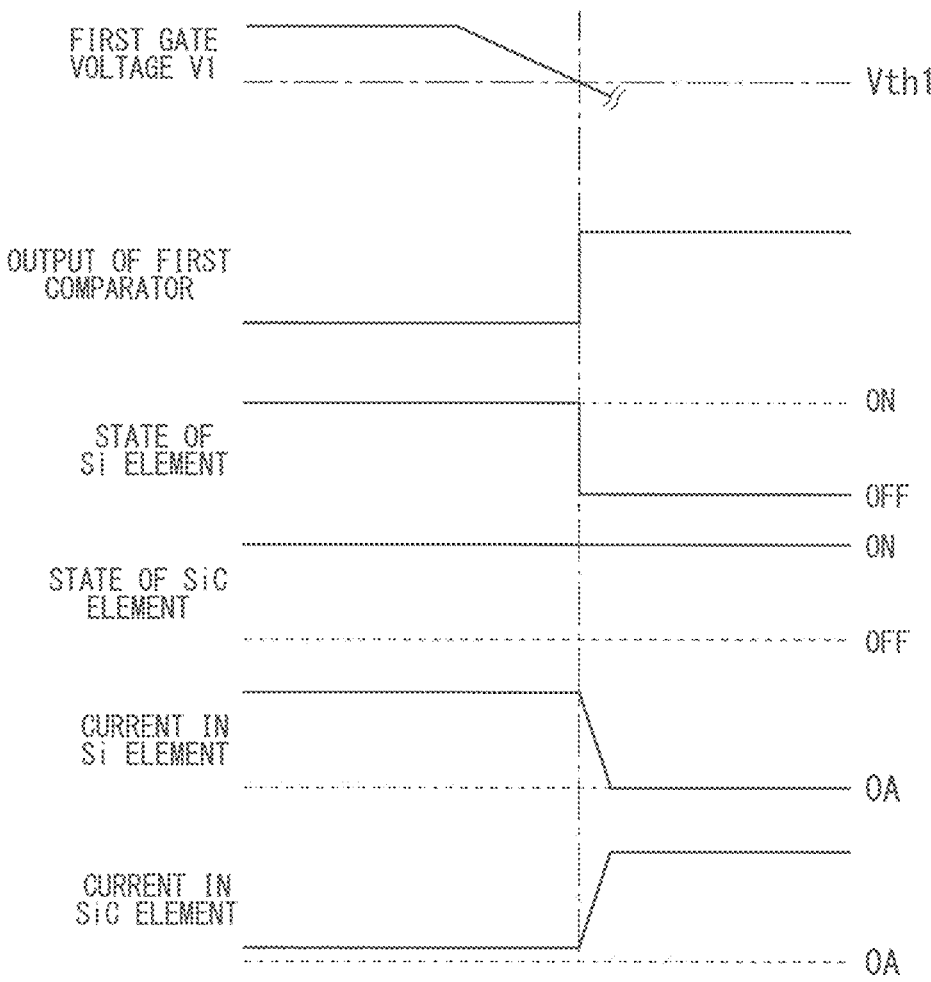

F I G .　6
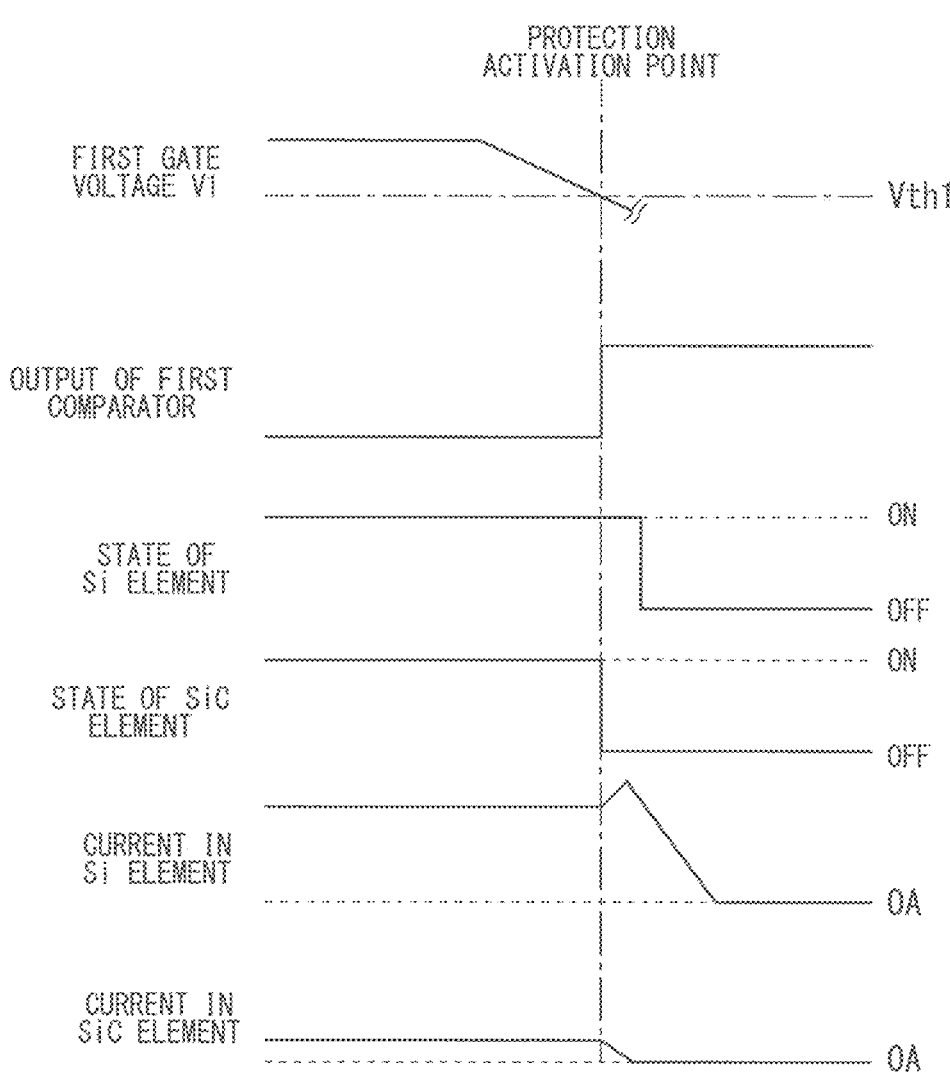

F I G. 7
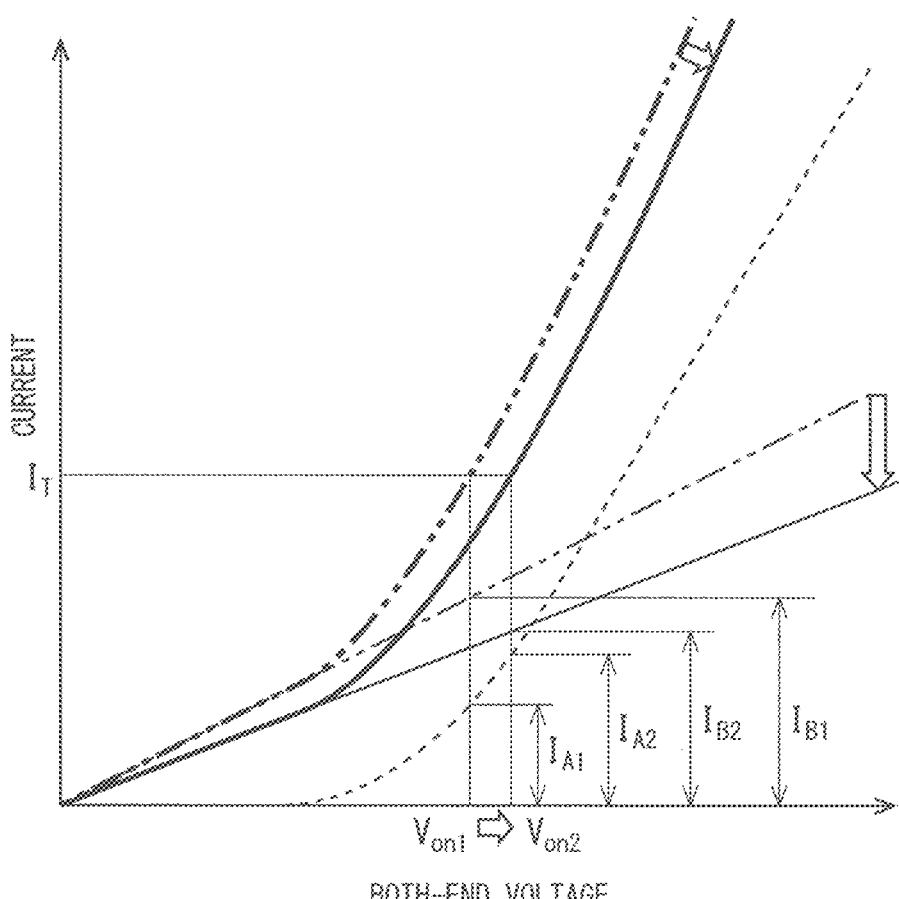

F I G. 8
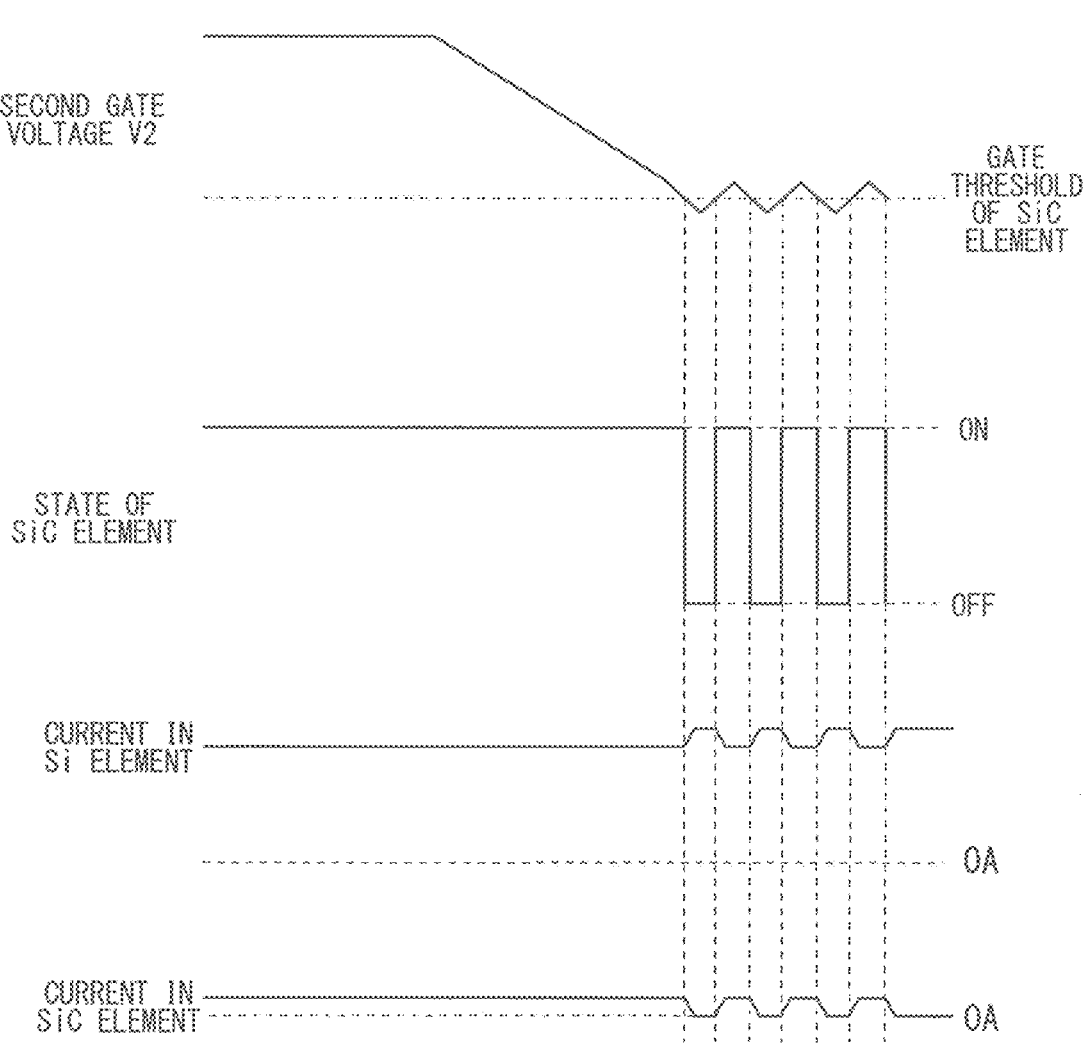

F I G. 9
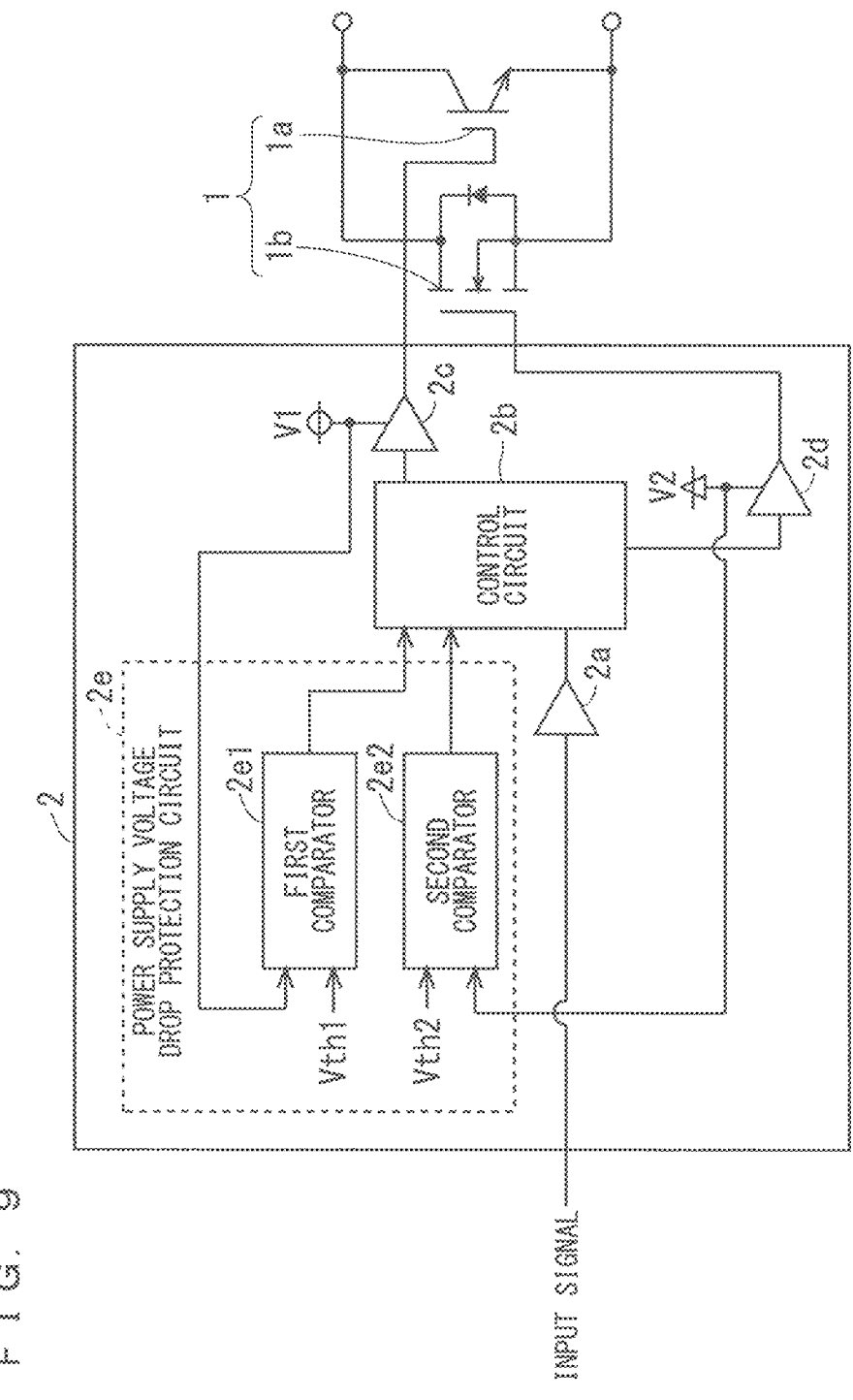

F I G .  1 0
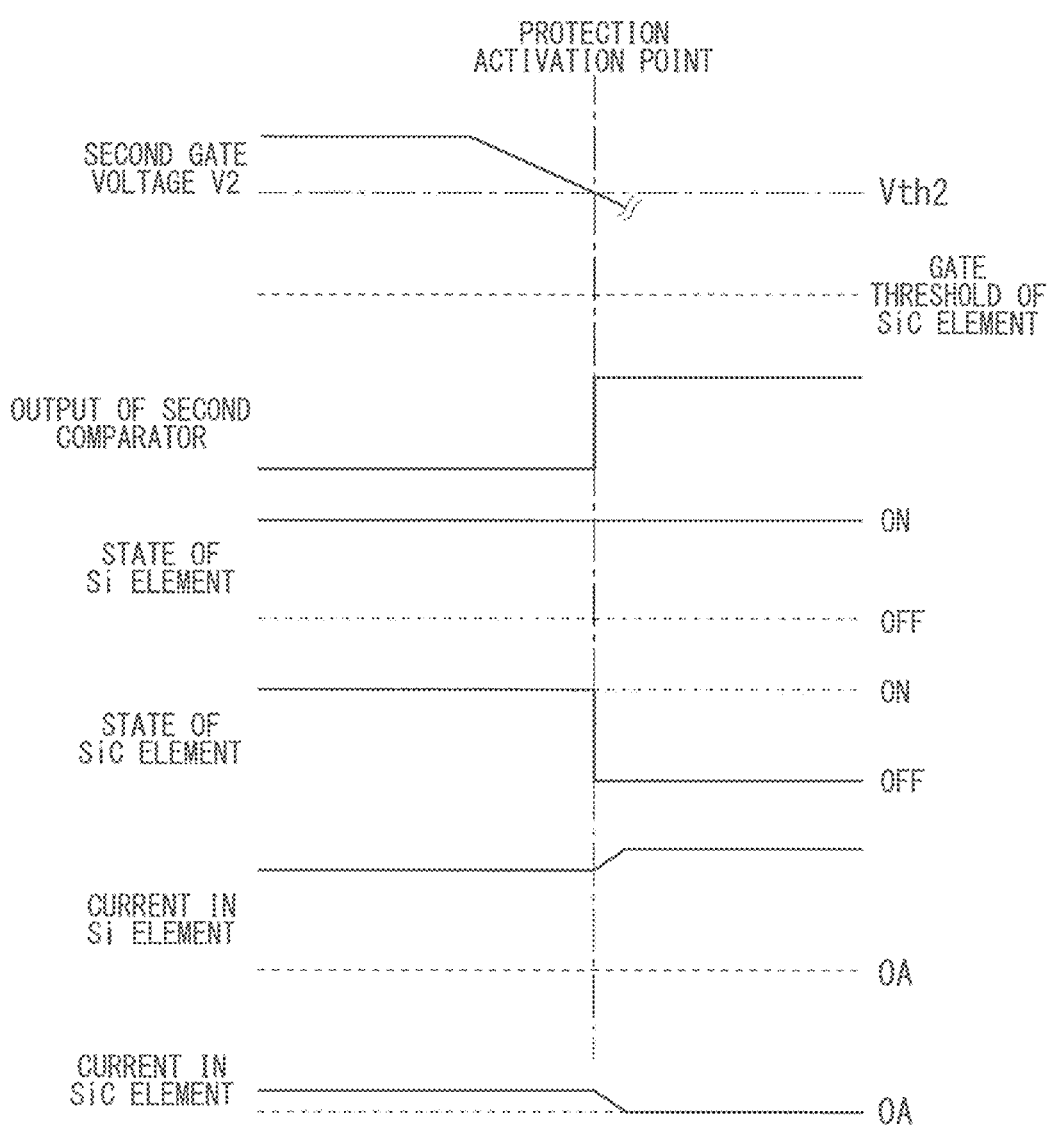

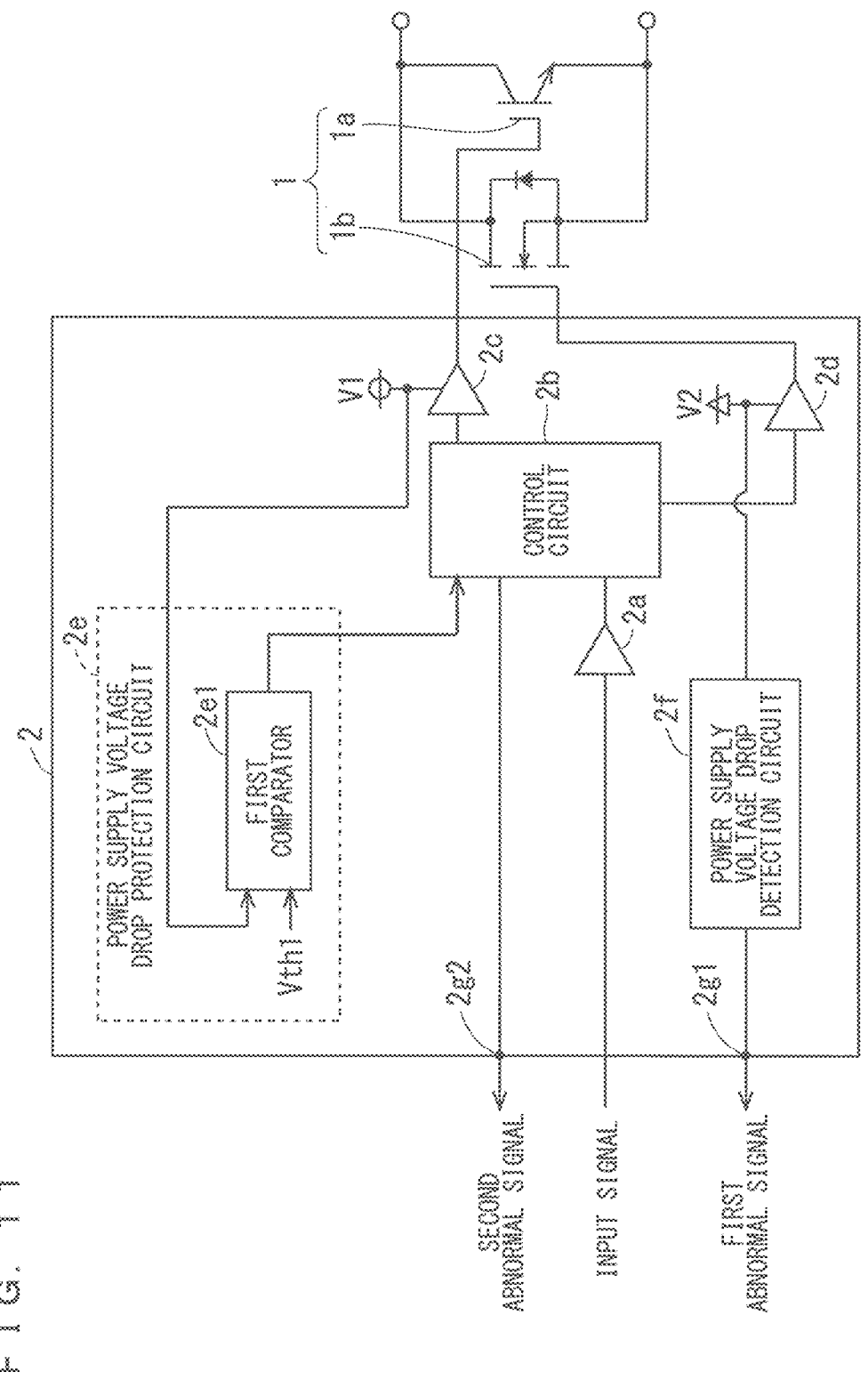
F I G.   1 1

F I G. 1 2
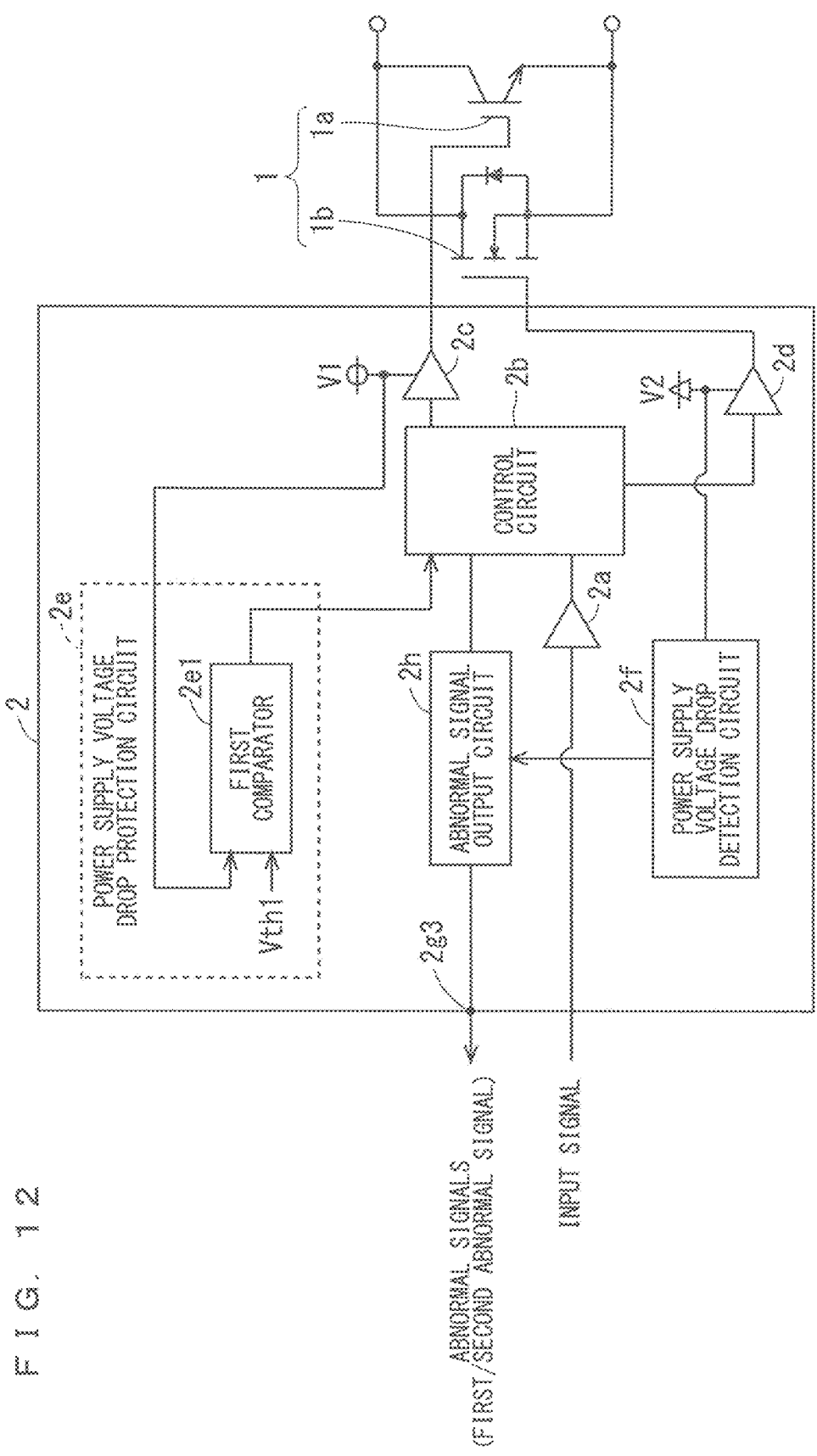

F I G. 1 3

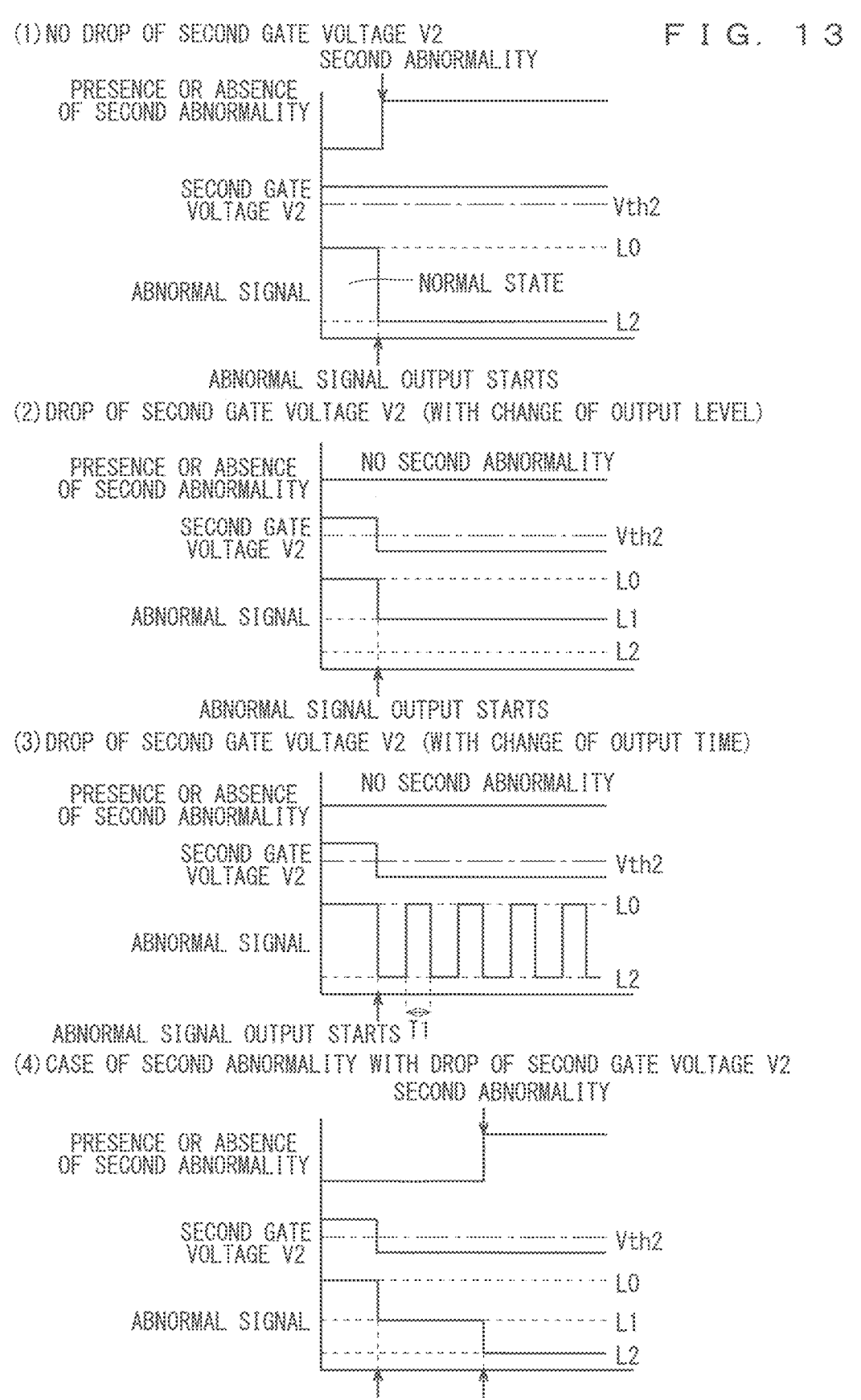

(1) NO DROP OF SECOND GATE VOLTAGE V2

PRESENCE OR ABSENCE OF SECOND ABNORMALITY — SECOND ABNORMALITY

SECOND GATE VOLTAGE V2 — Vth2

ABNORMAL SIGNAL — L0 — NORMAL STATE — L2

ABNORMAL SIGNAL OUTPUT STARTS (2) DROP OF SECOND GATE VOLTAGE V2 (WITH CHANGE OF OUTPUT LEVEL)

PRESENCE OR ABSENCE OF SECOND ABNORMALITY — NO SECOND ABNORMALITY

SECOND GATE VOLTAGE V2 — Vth2

ABNORMAL SIGNAL — L0 — L1 — L2

ABNORMAL SIGNAL OUTPUT STARTS (3) DROP OF SECOND GATE VOLTAGE V2 (WITH CHANGE OF OUTPUT TIME)

PRESENCE OR ABSENCE OF SECOND ABNORMALITY — NO SECOND ABNORMALITY

SECOND GATE VOLTAGE V2 — Vth2

ABNORMAL SIGNAL — L0 — L2

ABNORMAL SIGNAL OUTPUT STARTS T1

(4) CASE OF SECOND ABNORMALITY WITH DROP OF SECOND GATE VOLTAGE V2

PRESENCE OR ABSENCE OF SECOND ABNORMALITY — SECOND ABNORMALITY

SECOND GATE VOLTAGE V2 — Vth2

ABNORMAL SIGNAL — L0 — L1 — L2

ABNORMAL SIGNAL OUTPUT STARTS   PRIORITIZE SECOND ABNORMAL SIGNAL

F I G.  1 4
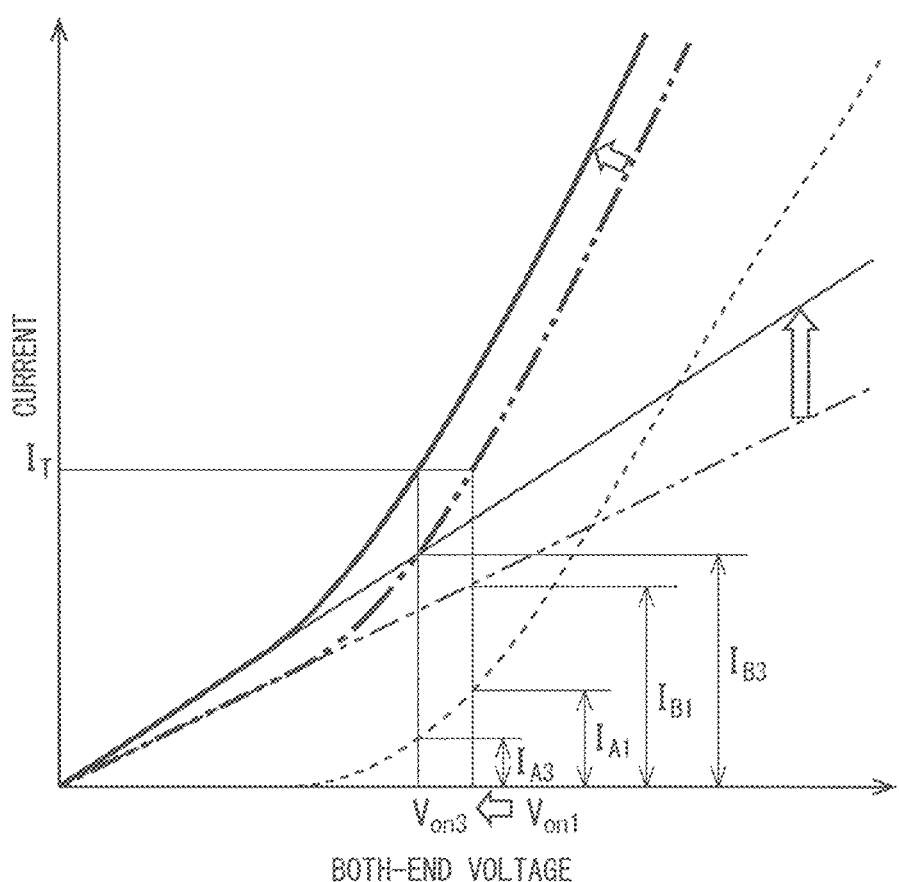

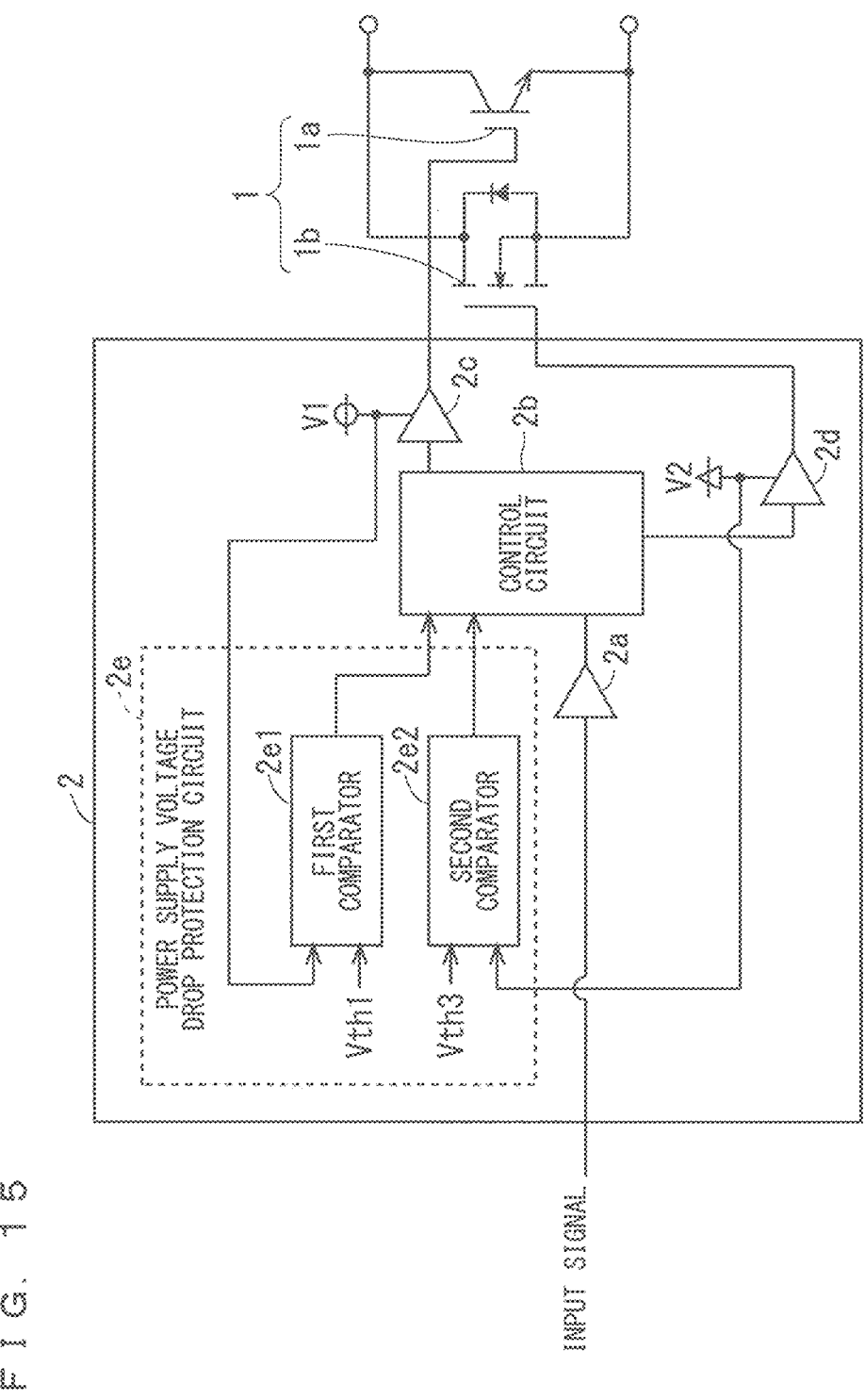
F I G. 1 5

F I G. 1 6
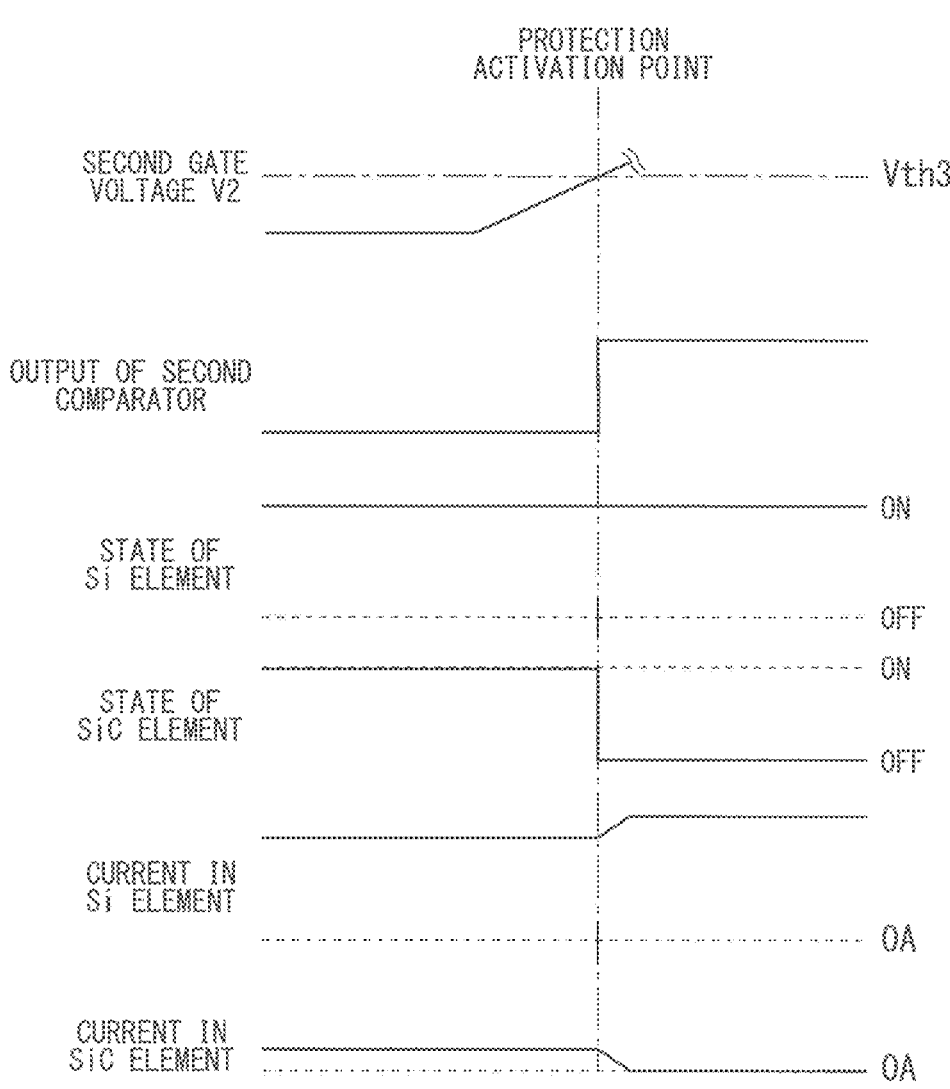

F I G . 1 7
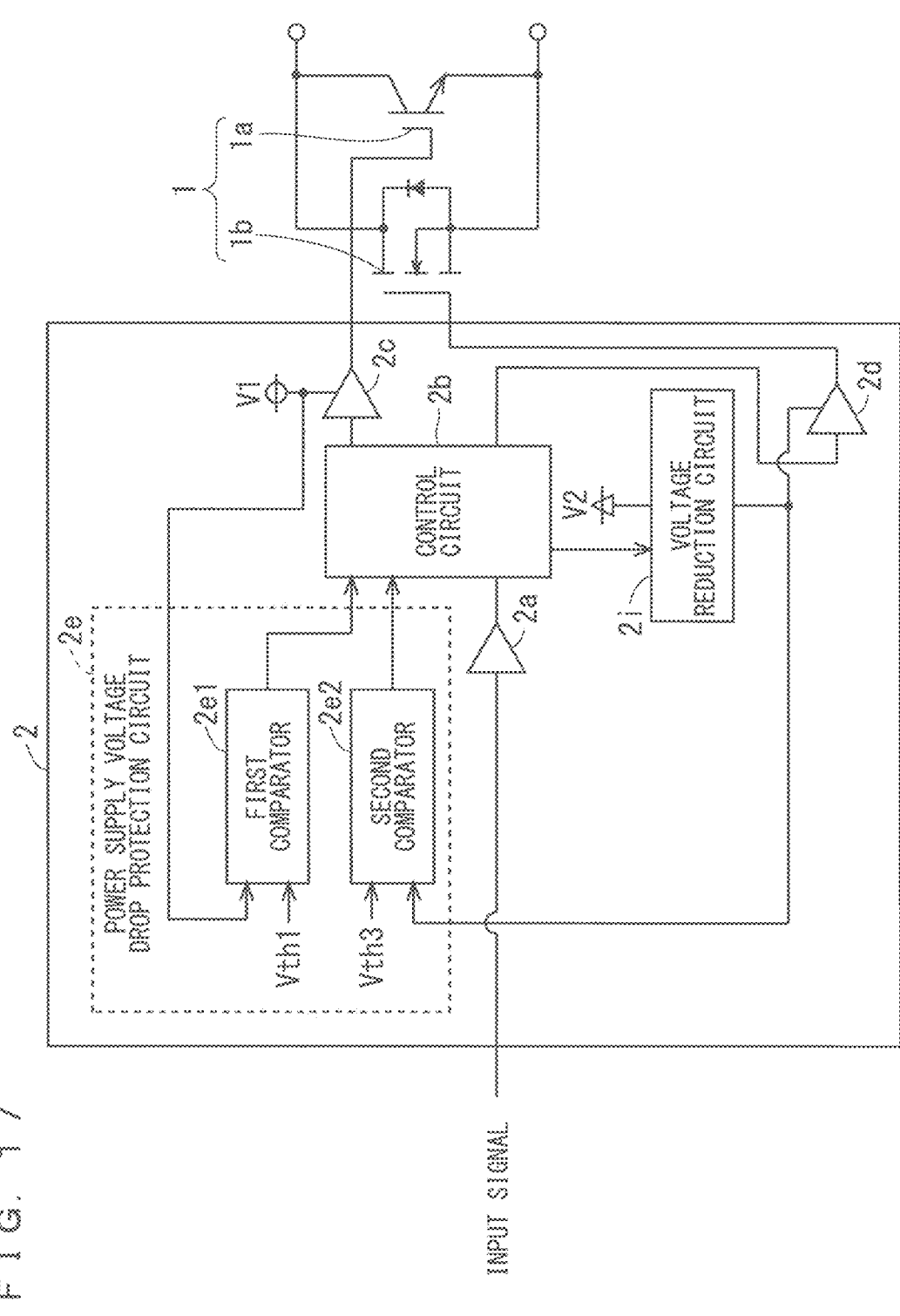

F I G.  1 8
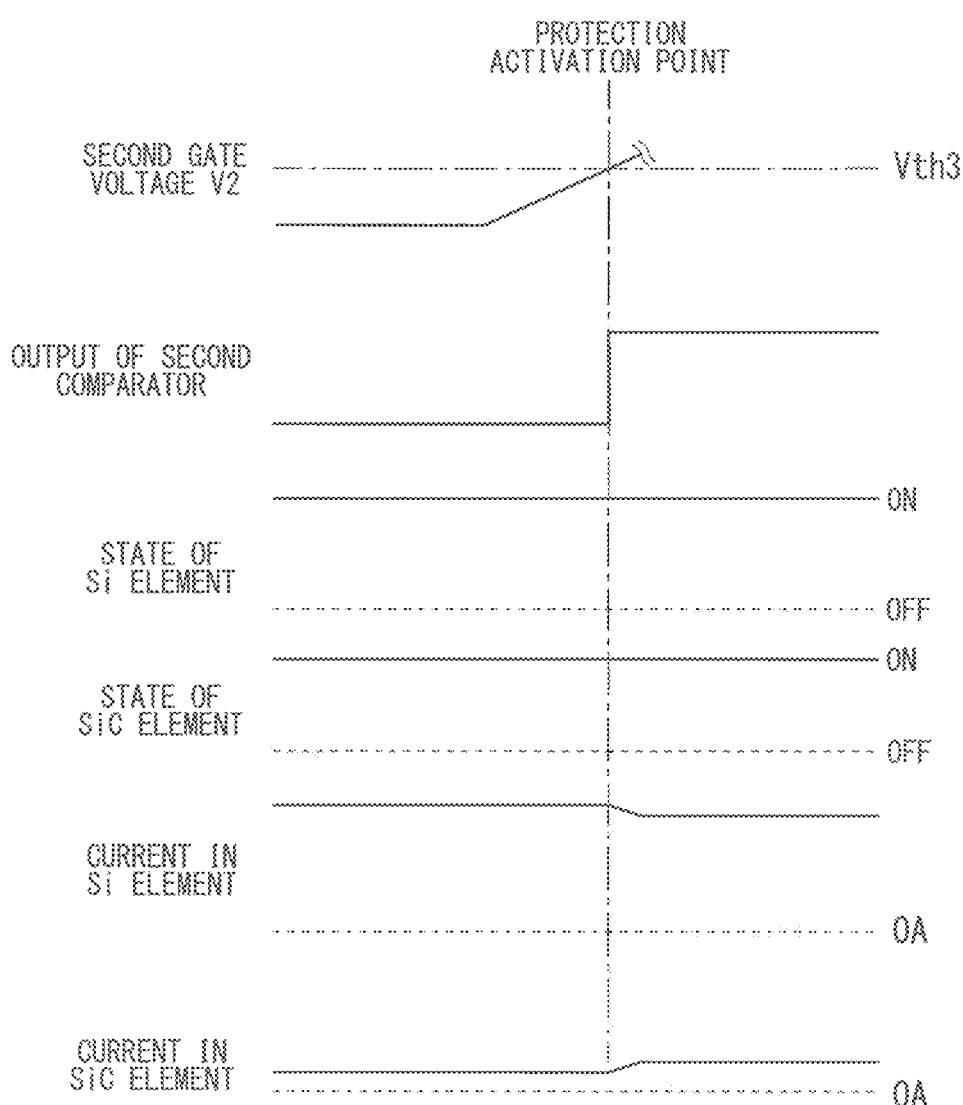

SEMICONDUCTOR DEVICE

BACKGROUND OF THE INVENTION

Field of the Invention

The present disclosure relates to a semiconductor device.

Description of the Background Art

Conventionally, Insulated Gate Bipolar Transistors (IGBTs) and Metal Oxide Semiconductor Field Effect Transistors (MOSFETs) composed of inexpensive silicon (Si) have generally been used as power elements in inverter devices and the like for driving motors. In the meantime, in recent years, more and more high-efficiency power elements composed of silicon carbide (SiC) or gallium nitride (GaN), being wide band gap (WBG) semiconductors, have been used.

However, the use of WBG semiconductors in cost-oriented consumer devices is not progressing rapidly enough due to their high price. Therefore, the use of a parallel circuit configured by connecting a small-sized SiC-MOSFET and a Si-IGBT in parallel in products for applications such as drive motors for home air conditioner compressors, which require long operating times at low currents, has been proposed (for example, Japanese Patent No. 6544316). According to such products, cost reduction is expected due to the small size of the SiC-MOSFET, and efficiency improvement (that is, reduction of loss) is anticipated due to the excellent DC characteristics of the SiC-MOSFET at low currents.

When the gate voltage applied to a gate to turn on the power element decreases, the On-voltage increases (that is, the deterioration of DC characteristics). This leads to an increase in loss, resulting in higher heat generation in a power element, which may cause a malfunction in the power element. Therefore, a configuration has been proposed in which a protection circuit is provided to suppress heat generation of the power element by turning off the power element when the gate voltage becomes equal to or less than a specified value.

However, for example, the problem lies in that, when the gate voltage of the Si-IGBT decreases in the parallel circuit as described above and the Si-IGBT of the power element is turned off while the parallel-connected SiC-MOSFET remains On, all the current flowing into the SiC-MOSFET, causing high heat generation, resulting in malfunction in the SiC-MOSFET.

SUMMARY

The present disclosure has been made in view of the above problems and has an object is to provide a technique that suppresses heat generation in a first semiconductor switching element and a second semiconductor switching element.

According to the present disclosure, a semiconductor device includes a first semiconductor switching element having a first gate, a second semiconductor switching element connected in parallel to the first semiconductor switching element, having a second gate, having a band gap larger than that of the first semiconductor switching element and having current carrying capacity lower than that of the first semiconductor switching element, and a gate drive circuit that drives each of the first semiconductor switching element and the second semiconductor switching element based on an input signal. When a first gate voltage applied to the first gate to turn On the first semiconductor switching element is lower than a first threshold, the gate drive circuit turns Off the first semiconductor switching element after turns Off the second semiconductor switching element regardless of the input signal.

Heat generation in the first semiconductor switching element and the second semiconductor switching element is suppressed.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a perspective view illustrating an external configuration of a semiconductor device according to Embodiment 1;

FIG. 3 is a diagram illustrating an application example of the semiconductor device according to Embodiment 1;

FIG. 4 is a diagram illustrating a configuration of the semiconductor device according to Embodiment 1;

FIG. 5 is a timing chart illustrating the operation of a related semiconductor device;

FIG. 6 is a timing chart illustrating the operation of the semiconductor device according to Embodiment 1;

FIG. 7 is a graph illustrating changes in current when the first gate voltage does not change and the second gate voltage decreases;

FIG. 8 is a timing chart illustrating a specific situation;

FIG. 9 is a diagram illustrating a configuration of a semiconductor device according to Embodiment 2;

FIG. 10 is a timing chart illustrating the operation of the semiconductor device according to Embodiment 2;

FIG. 11 is a diagram illustrating a configuration of a semiconductor device according to Embodiment 3;

FIG. 12 is a diagram illustrating a configuration of a semiconductor device according to Embodiment 4;

FIG. 13 is a diagram illustrating waveforms output from the semiconductor device according to Embodiment 4;

FIG. 14 is a graph illustrating changes in current when the first gate voltage does not change and the second gate voltage increases;

FIG. 15 is a diagram illustrating a configuration of a semiconductor device according to Embodiment 5;

FIG. 16 is a timing chart illustrating the operation of the semiconductor device according to Embodiment 5;

FIG. 17 is a diagram illustrating a configuration of the semiconductor device according to Embodiment 5; and FIG. 18 is a timing chart illustrating the operation of the semiconductor device according to Embodiment 5.

DESCRIPTION OF THE PREFERRED EMBODIMENTS

Figure 2:
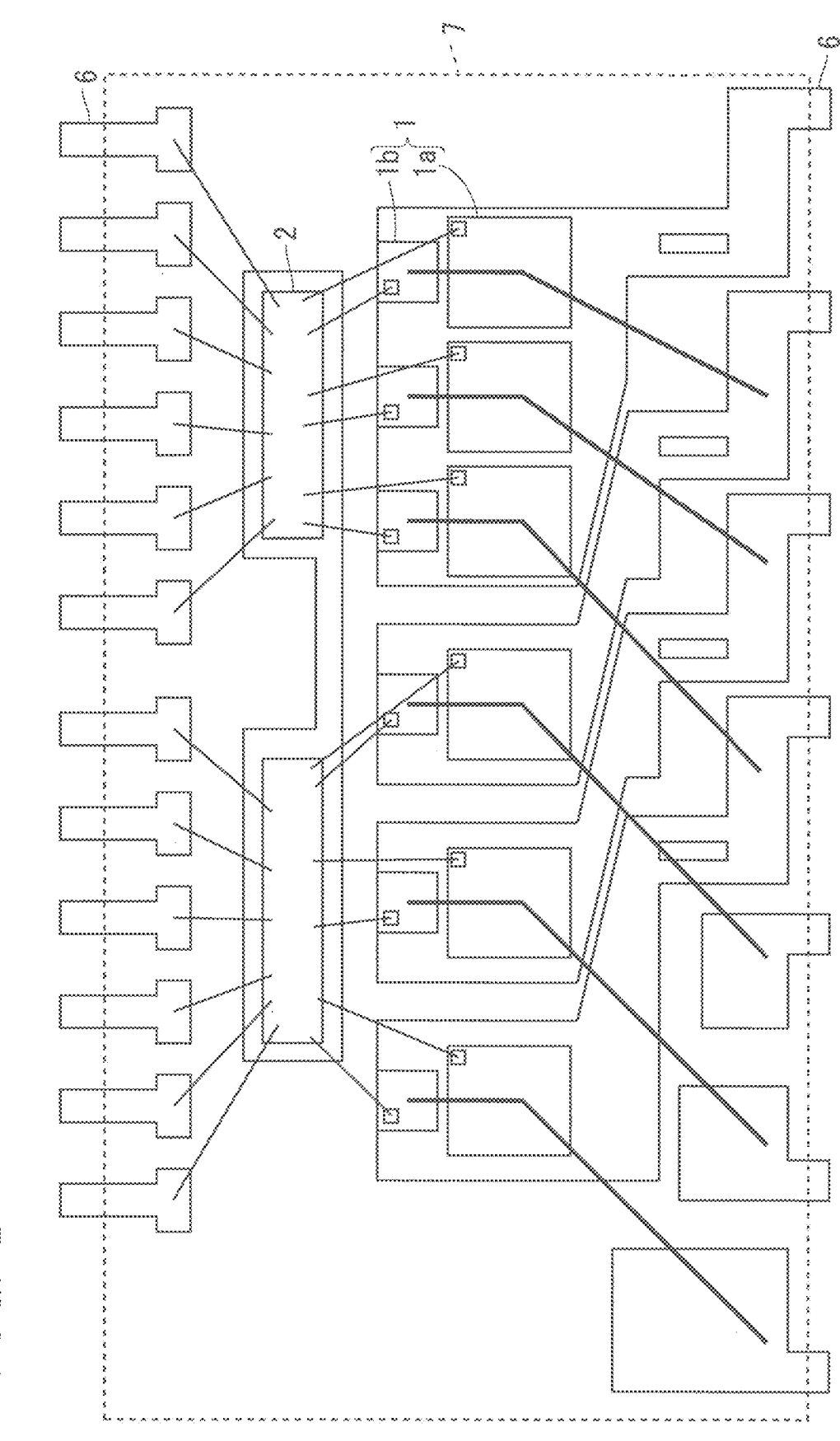
FIG. 2 is a plan view illustrating an internal configuration of the semiconductor device according to Embodiment 1.

Embodiments will be described below with reference to the accompanying drawings. The features described in each Embodiment below are illustrative, and not all features are necessarily essential. Also, in the description given below, the same or similar reference numerals are given to the same components in a plurality of Embodiments, and different components will be mainly explained.

Embodiment 1

FIG. 1 is a perspective view illustrating an external configuration of a semiconductor device according to Embodiment 1 and FIG. 2 is a plan view illustrating an internal configuration of the semiconductor device. As illustrated in FIG. 2, the semiconductor device according to Embodiment 1 includes a parallel circuit 1, a gate drive circuit 2, a lead frame 6, and a sealing member 7.

The parallel circuit 1 includes a first semiconductor switching element having a first gate and a second semiconductor switching element having a second gate, and the first semiconductor switching element and the second semiconductor switching element are connected in parallel.

In Embodiment 1, the first semiconductor switching element is an Si element 1*a* composed of silicon (Si). Although the Si element 1*a* will be described below as an IGBT, it is not limited to an IGBT, and may be a reverse conducting-IGBT (RC-IGBT) or a MOSFET.

In Embodiment 1, the second semiconductor switching element is an SiC element 1*b* composed of silicon carbide (SiC). However, the second semiconductor switching element is not limited thereto, as long as it has a larger band gap, is smaller in size, and has lower current carrying capacity than the first semiconductor switching element. For example, the second semiconductor switching element may be an element composed of a Wide Band Gap (WBG) semiconductor such as GaN or diamond. With the SiC element 1*b* composed of SiC, improvement in efficiency, that is, reduction of loss is enabled.

In the following, although the description is made that the SiC element 1*b* assumed to be a MOSFET that is particularly effective at low current and low loss, it is not limited thereto and an IGBT or the like may be adoptable therefor.

Note that the current carrying capacity of the SiC element 1*b* being lower than that of the Si element 1*a* is equivalent to the saturation current value of the SiC element 1*b* being smaller than the saturation current value of the Si element 1*a* with respect to the applied gate voltage, for example. The size of the SiC element 1*b* can be made smaller than the size of the Si element 1*a* by lowering the current carrying capacity of the SiC element 1*b*, allowing for a cost reduction in the semiconductor device. Further, even when the current carrying capacity is lowered, the On-voltage of the SiC element 1*b* composed of the WBG semiconductor at low current can be lower than the On-voltage of the Si element 1*a*, reducing the loss.

The gate drive circuit 2 is connected to the first gate of the Si element 1*a* and the second gate of the SiC element 1*b*, and drives each of the Si element 1*a* and the SiC element 1*b* as described later. The lead frame 6 is electrically connected to parallel circuit 1 and gate drive circuit 2. As illustrated in FIGS. 1 and 2, the sealing member 7 covers the parallel circuits 1, the gate drive circuits 2, and the lead frames 6 with a portion of the lead frames 6 exposed.

Note that although the number of parallel circuits 1 in FIG. 2 is six and the number of gate drive circuits 2 is two, they are not limited thereto. For example, as illustrated in FIG. 3, a three-phase motor drive circuit may be configured by connecting six parallel circuits 1 and six gate drive circuits 2 to a drive motor 8 that drives the compressor of a home appliance such as an air conditioner. For convenience of explanation, a configuration in which one gate drive circuit 2 is provided for one parallel circuit 1 will be described below as an example.

FIG. 4 is a diagram illustrating a configuration of the semiconductor device according to Embodiment 1, and specifically, a diagram illustrating the configurations of the parallel circuit 1 and the gate drive circuit 2 according to Embodiment 1 in detail.

The parallel circuit 1 is configured by connecting the collector and the emitter of the Si element 1*a* and the drain and the source of the SiC element 1*b*, respectively. The first gate of the Si element 1*a* and the second gate of the SiC element 1*b* are connected to the gate drive circuit 2.

The outline of the gate drive circuit 2 will be described before the detailed description thereof. The gate drive circuit 2 receives an input signal selectively turning On and Off from an external controller such as a microcomputer (not illustrated).

The gate drive circuit 2 drives each of the Si element 1*a* and the SiC element 1*b* based on the input signal. In Embodiment 1, basically, the gate drive circuit 2 turns On the Si element 1*a* and the SiC element 1*b* when the input signal is On, and turns Off the Si element 1*a* and the SiC element 1*b* when the input signal is Off.

However, as an exception to the above operation, the gate drive circuit 2 turns Off the Si element 1*a* after turns Off the SiC element 1*b* regardless of the input signal when the first gate voltage is lower than a first threshold. Note that the first gate voltage is a voltage applied to the first gate of the Si element 1*a* to turn On the Si element 1*a*. Also, a second gate voltage, which will be described later, is a voltage applied to the second gate of the SiC element 1*b* to turn On the SiC element 1*b*.

Next, details of the gate drive circuit 2 will be described. The gate drive circuit 2 includes a buffer circuit 2*a*, a control circuit 2*b*, a first buffer circuit 2*c*, a second buffer circuit 2*d*, and a power supply voltage drop protection circuit 2*e*. Each of the buffer circuit 2*a*, the control circuit 2*b*, the first buffer circuit 2*c*, the second buffer circuit 2*d*, and the power supply voltage drop protection circuit 2*e* is a logic circuit.

The buffer circuit 2*a* maintains the input logical value of the input signal and outputs it.

The control circuit 2*b* turns On the Si element 1*a* and the SiC element 1*b* when the input signal input through the buffer circuit 2*a* switches to an On state, and turns Off the Si element 1*a* and the SiC element 1*b* when the input signal switches to an Off state. For example, when the input signal switches to the On state, the control circuit 2*b* may turn On the SiC element 1*b* after turn On the Si element 1*a*, and when the input signal switches to the Off state, the control circuit 2*b* may turn Off the Si element 1*a* after turn Off the SiC element 1*b*. In other words, the control circuit 2*b* may be configured to provide a time difference between when the Si element 1*a* and the SiC element 1*b* are turned on, and a time difference between when the Si element 1*a* and the SiC element 1*b* are turned off. This results in the current that has flowed only through the first turned-on Si element 1*a* being diverted to the SiC element 1*b* in a ratio corresponding to the DC characteristic differences between the elements.

The first buffer circuit 2*c* applies an externally supplied voltage V1 to the first gate of the Si element 1*a* when the control circuit 2*b* turns On the Si element 1*a*. As a result, the first gate voltage becomes substantially the same as the voltage V1; therefore, it may be referred to as the first gate voltage V1 in the following description. For the first gate voltage V1, a voltage of around 15V is used, for example, however, a voltage with a value other than this may be used depending on the characteristics of the Si element 1*a*.

The second buffer circuit 2*d* applies an externally supplied voltage V2 to the second gate of the SiC element 1*b* when the control circuit 2*b* turns On the SiC element 1*b*. As a result, the second gate voltage becomes substantially the same as the voltage V2; therefore, it may be referred to as the second gate voltage V2 in the following description. For the second gate voltage V2, a voltage of around 15V is used, for example, however, a voltage with a value other than this may be used depending on the characteristics of the SiC element 1b.

In a configuration in which the voltages V1 and V2 are supplied externally, if for any reason such as abnormality, the voltages V1 and V2 decrease, the On-voltages of the Si element 1a and the SiC element 1b increase (that is, the DC characteristics deteriorate). Consequently, the loss increases and heat generation of these elements increases, which may cause malfunctions in the Si element 1a and the SiC element 1b. Therefore, the control circuit 2b and the power supply voltage drop protection circuit 2e have a protection function to suppress heat generation of the Si element 1a and the SiC element 1b. Next, the protection function will be described.

The power supply voltage drop protection circuit 2e according to embodiment 1 includes a first comparator 2e1. The first comparator 2e1 compares the first gate voltage V1 to a threshold voltage Vth1 corresponding to a predefined first threshold. The threshold voltage Vth1 is, for example, a voltage lower by a certain voltage (for example, 2 to 3V) than the standard first gate voltage V1 in normal times, and is a voltage higher than the gate threshold of the Si element 1a, and may be changed to an appropriate value according to the characteristics of the Si element 1a. The first comparator 2e1 outputs different output signals to the control circuit 2b depending on whether the first gate voltage V1 is equal to or higher than the threshold voltage Vth1 or lower than the threshold voltage Vth1. Note that, for example, a comparator is used as the first comparator 2e1.

When the control circuit 2b receives an output signal from the first comparator 2e1 when the first gate voltage V1 is lower than the threshold voltage Vth1, the control circuit 2b turns Off the Si element 1a after turns Off the SiC element 1b regardless of the input signal.

FIG. 5 is a timing chart illustrating the operation of a related semiconductor device related to the semiconductor device according to Embodiment 1. The related semiconductor device turns Off the Si element 1a and keeps the SiC element 1b On when the first gate voltage V1 is lower than the threshold voltage Vth1. According to such a configuration, the Si element 1a whose loss has increased due to the decrease in the first gate voltage V1 is stopped, suppressing the heat generation of the Si element 1a.

However, when the Si element 1a is stopped, the current flowing in the Si element 1a flows to the SiC element 1b, increasing the heat generation of the SiC element 1b, which may cause a malfunction in the SiC element 1b. The possibility of this is particularly high in compressor drive motors for home appliances such as home air conditioners, in which the size of the SiC element 1b is reduced to reduce the cost of the semiconductor device, and the DC characteristics of the SiC element 1b are enhanced to reduce the loss.

FIG. 6 is a timing chart illustrating the operation of the semiconductor device according to Embodiment 1. The semiconductor device according to Embodiment 1 turns Off the Si element 1a after turns Off the SiC element 1b, regardless of the input signal, when the first gate voltage V1 is lower than threshold voltage Vth1. According to such a configuration, not only the heat generation of the Si element 1a can be suppressed, but also the heat generation of the SiC element 1b can be suppressed. Note that in FIG. 6, an On-current of the SiC element 1b is smaller than an on-current of the Si element 1a, reflecting that the SiC element 1b having a lower current carrying capacity than the Si element 1a.

Meanwhile, in the semiconductor device according to Embodiment 1, the power supply voltage drop protection circuit 2e and the control circuit 2b monitor a drop in the first gate voltage V1 to protect the Si element 1a and the SiC element 1b and do not monitor a drop in the second gate voltage V2. The reason for this will be explained below.

FIG. 7 is a graph illustrating changes in the current flowing through the Si element 1a and the SiC element 1b when the first gate voltage V1 does not change and the second gate voltage V2 decreases. The horizontal axis represents the voltage applied between the collector and the emitter of the Si element 1a and between the drain and the source of the SiC element 1b (hereinafter referred to as "both-end voltage"), and the vertical axis represents the On current of the Si element 1a and the SiC element 1b.

The dotted line in FIG. 7 represents the relationship between the both-end voltage (that is, the ON voltage) and the ON current of the Si element 1a, and the thin solid line and the thin two-dot chain line in FIG. 7 represent the relationship between the both-end voltage and the ON current of the SiC element 1b. The thick solid line and the thick two-dot chain line in FIG. 7 represent the relationship between the both-end voltage and the On current of the parallel circuit 1, representing, essentially, the equivalence of the combined relationship between the both-end voltage and the On current of the Si element 1a and the both-end voltage and the On current of the SiC element 1b. The two-dot chain line represents the relationship between the both-end voltage and the On current before the second gate voltage V2 decreases, and the solid line represents the relationship between the both-end voltage and the On current after the second gate voltage V2 decreases.

$V_{on1}$ represents the both-end voltage of each of the Si element 1a and the SiC element 1b, $I_{A1}$ represents the On current of the Si element 1a, $I_{B1}$ represents the On current of the SiC element 1b, and $I_T$ represents the On current of the parallel circuit 1 ($=I_{A1}+I_{B1}$) before the second gate voltage V2 decreases. Note that the On current of the Si element 1a and the On current of the SiC element 1b are significantly different between FIGS. 6 and 7, this is because FIG. 6 illustrates the relationship when $I_T$ is a large current whereas FIG. 7 illustrates the relationship when $I_T$ is a small current for convenience.

When the second gate voltage V2 decreases, less current flows through the SiC element 1b, so the slope decreases as is from the thin two-dot chain line to the solid thin line. The both-end voltage is changed from $V_{on1}$ to a large $V_{on2}$ so that the On current ($I_T$) of the parallel circuit 1 is maintained even if the second gate voltage V2 decreases. As a result, the On current of the Si element 1a increases from $I_{A1}$ to $I_{A2}$, but the On current of the SiC element 1b decreases from $I_{B1}$ to $I_{B2}$, establishing $I_T=I_{A2}+I_{B2}$.

In line with the current carrying capacity of the Si element 1a being higher than the current carrying capacity of the SiC element 1b, the allowable current of the Si element 1a has more margin than the allowable current of the SiC element 1b; therefore, even if the On current of the Si element 1a becomes somewhat larger, no problem will occur in the Si element 1a. Accordingly, in spite of slight efficiency deterioration, the system operation can be carried on by monitoring the decrease in the On current of the parallel circuit 1 without monitoring the decrease in the second gate voltage V2.

Summary of Embodiment 1

According to the semiconductor device according to above Embodiment 1, the gate drive circuit 2 turns Off the Si element 1*a* after turns Off the SiC element 1*b* regardless of the input signal when the first gate voltage is lower than the first threshold. According to such a configuration, the heat generation of the Si element 1*a* and the SiC element 1*b* is suppressed; therefore, the malfunctions that occur in the Si element 1*a* and the SiC element 1*b* due to the heat are suppressed. Further, in Embodiment 1, a circuit for monitoring the drop in the second gate voltage V2 is not required; therefore, simplification, downsizing, and cost reduction of the semiconductor device can be expected.

Embodiment 2

In Embodiment 1, the decrease in the second gate voltage V2 does not cause a problem in system operation; therefore, the gate drive circuit 2 monitors only the decrease in the first gate voltage V1 to protect the Si element 1*a* and the SiC element 1*b*.

Yet, the decrease in the second gate voltage V2 may lead to undesirable specific situations. As specific situations include, for example, as illustrated in FIG. 8, a situation in which the SiC element 1*b* repeats insufficient On and Off due to the second gate voltage V2 dropping to the gate threshold of the SiC element 1*b* and repeating, in short periods, rising and falling around the gate threshold. In this case, gate oscillation or the like may occur, leading to a malfunction of the semiconductor device. Therefore, in order to avoid the specific situations, as described below, the semiconductor device according to Embodiment 2 is configured to monitor the decrease in the second gate voltage V2 to protect the Si element 1*a* and the SiC element 1*b*.

FIG. 9 is a diagram illustrating a configuration of the semiconductor device according to Embodiment 2, and specifically, a diagram illustrating the configurations of the parallel circuit 1 and the gate drive circuit 2 according to Embodiment 2 in detail. The configuration of FIG. 9 is similar to the configuration in which a second comparator 2*e*2 is added to the power supply voltage drop protection circuit 2*e* of the configuration of FIG. 4.

The first comparator 2*e*2 compares the second gate voltage V2 to a threshold voltage Vth2 corresponding to a predefined second threshold. The threshold voltage Vth2 is, for example, a voltage lower by a certain voltage (for example, 2 to 3V) than the standard second gate voltage V2 in normal times, and is a voltage higher than the gate threshold of the SiC element 1*b*, and may be changed to an appropriate value according to the characteristics of the SiC element 1*b*. The second comparator 2*e*2 outputs different output signals to the control circuit 2*b* depending on whether the second gate voltage V2 is equal to or higher than the threshold voltage Vth2 or lower than the threshold voltage Vth2. Note that, for example, a comparator is used as the second comparator 2*e*2.

As illustrated in FIG. 10, when the control circuit 2*b* receives an output signal from the second comparator 2*e*2 when the second gate voltage V2 is lower than the threshold voltage Vth2, the control circuit 2*b* turns Off the SiC element 1*b*. Note that in Embodiment 2, while the control circuit 2*b* turns Off the SiC element 1*b* when the second gate voltage V2 is lower than the threshold voltage Vth2, carries on driving the Si element 1*a* based on the input signal. In this case, the current flowing through the SiC element 1*b* is to flow through the Si element 1*a*. However, in line with the current carrying capacity of the Si element 1*a* being higher than the current carrying capacity of the SiC element 1*b*, the allowable current of the Si element 1*a* has more margin than the allowable current of the SiC element 1*b*; therefore, even if the On current of the Si element 1*a* becomes somewhat larger, no problem will occur in the Si element 1*a*.

Summary of Embodiment 2

According to the semiconductor device according to above Embodiment 2, the gate drive circuit 2 turns Off the SiC element 1*b* regardless of the input signal when the second gate voltage is lower than the second threshold. According to such a configuration, the specific situation as illustrated in FIG. 8 can be avoided.

Embodiment 3

In Embodiment 1, the gate drive circuit 2 carries on operating the system even when the second gate voltage V2 decreased. However, when the second gate voltage V2 decreases, the efficiency of the system deteriorates, so it is preferable to notify the user that an abnormality has occurred and urge the user to make repairs. Therefore, the semiconductor device according to Embodiment 3 is configured to make such a notification as described below.

FIG. 11 is a diagram illustrating a configuration of the semiconductor device according to Embodiment 3, and specifically, a diagram illustrating the configurations of the parallel circuit 1 and the gate drive circuit 2 according to Embodiment 3 in detail. The configuration of FIG. 11 is similar to the configuration in which a power supply voltage drop detection circuit 2*f* is added to the gate drive circuit 2 of the configuration of FIG. 4.

When the second gate voltage V2 is lower than the threshold voltage Vth2 corresponding to a predefined second threshold, the power supply voltage drop detection circuit 2*f* outputs a first abnormal signal from an output terminal 2*g*1 to an external controller. Note that the power supply voltage drop detection circuit 2*f* is configured to include, for example, a comparator similar to the second comparator 2*e*2 described in Embodiment 2.

When the control circuit 2*b* detects an abnormality different from the first abnormal signal in the semiconductor device and stops the operation of the system, the control circuit 2*b* outputs a second abnormal signal indicating the abnormality different from the first abnormal signal from the output terminal 2*g*2 to the external controller.

Summary of Embodiment 3

According to the semiconductor device according to above Embodiment 3, the gate drive circuit 2 outputs the first abnormal signal to the external controller when the second gate voltage is lower than the second threshold. According to such a configuration, urging the user to make repairs by notifying the external controller of the second gate voltage being low is enabled while carrying on operating the system.

Embodiment 4

FIG. 12 is a diagram illustrating a configuration of a semiconductor device according to Embodiment 4, and specifically, a diagram illustrating the configurations of the parallel circuit 1 and the gate drive circuit 2 according to Embodiment 4 in detail. The configuration of FIG. 12 is similar to the configuration in which an abnormal signal output circuit 2*h* is added to the gate drive circuit 2 of the configuration of FIG. 11.

The abnormal signal output circuit 2h outputs the first abnormal signal from the power supply voltage drop detection circuit 2f and the second abnormal signal from the control circuit 2b in mutually distinguishable waveforms from one output terminal 2g3.

FIG. 13 is a diagram illustrating an example of a waveform output from the abnormal signal output circuit 2h. In (1) of FIG. 13 illustrates the waveform when the power supply voltage drop detection circuit 2f does not detect the first abnormality and the control circuit 2b detects the second abnormality (for example, a drop in the first gate voltage V1). In this case, a second abnormal signal of output level L2 is output. Although not illustrated, when the power supply voltage drop detection circuit 2f does not detect the first abnormality and the control circuit 2b does not detect the second abnormality, a steady signal of output level L0 is output to the external controller.

In (2) and (3) of FIG. 13 illustrate the waveforms when the control circuit 2b does not detect the second abnormality, and the power supply voltage drop detection circuit 2f detects the first abnormality (second gate voltage V2 lower than the threshold voltage Vth2).

In (2) of FIG. 13, when the power supply voltage drop detection circuit 2f detects the first abnormality, the first abnormal signal having an output level L1 different from the output level L2 of the second abnormal signal is output. In this case, the external controller can distinguish between the first abnormal signal and the second abnormal signal based on the difference in output level.

In (3) of FIG. 13, when the power supply voltage drop detection circuit 2f detects the first abnormality, the first abnormal signal having the same output level as the output level L2 of the second abnormal signal is output intermittently at the output time T1. In this case, the external controller can distinguish between the first abnormal signal and the second abnormal signal based on the difference in output time.

In (4) of FIG. 13 illustrates waveforms when the power supply voltage drop detection circuit 2f and the control circuit 2b detect the first abnormality and the second abnormality, respectively. In the case (4) of FIG. 13, the second abnormality is detected after the first abnormality, so the abnormal signal changes from the first abnormal signal having the output level L1 indicating the first abnormal state to the second abnormal signal having the output level L2 indicating the second abnormal state. The second abnormality is an abnormality in which both the Si element 1a and the SiC element 1b are turned off and the system stops; therefore, the continuation of the output of the second abnormal signal is prioritized over the output of the first abnormal signal. Although not illustrated here, even when the first abnormality is detected after the second abnormality, the continuation of the output of the second abnormal signal is prioritized over the output of the first abnormal signal.

Summary of Embodiment 4

According to the semiconductor device according to Embodiment 4 as described above, the gate drive circuit 2 outputs the first abnormal signal and the second abnormal signal to the outside from one output terminal 2g3 in mutually distinguishable waveforms. According to such a configuration, the number of output terminals of the gate drive circuit 2 can be reduced, and the downsizing of the gate drive circuit 2 can be expected.

Embodiment 5

In Embodiment 1, the gate drive circuit 2 carries on operating the system even when the second gate voltage V2 decreased. Meanwhile, when the second gate voltage V2 increases, the heat generation of the SiC element 1b increases. This will be explained below.

FIG. 14, a graph similar to FIG. 7, is a graph illustrating changes in the current flowing through the Si element 1a and the SiC element 1b when the first gate voltage V1 does not change and the second gate voltage V2 increases. However in FIG. 14, the two-dot chain line represents the relationship between the both-end voltage and the On current before the second gate voltage V2 increases, and the solid line represents the relationship between the both-end voltage and the On current after the second gate voltage V2 increases.

$V_{on1}$ represents the both-end voltage of each of the Si element 1a and the SiC element 1b, $I_{A1}$ represents the On current of the Si element 1a, $I_{B1}$ represents the On current of the SiC element 1b, and $I_T$ represents the On current of the parallel circuit 1 ($=I_{A1}+I_{B1}$) before the second gate voltage V2 increases.

When the second gate voltage V2 increases, more current flows through the SiC element 1b, so the slope increases as is from the thin two-dot chain line to the solid thin line. The both-end voltage is changed from Von to a small $V_{on2}$ so that the On current ($I_T$) of the parallel circuit 1 is maintained even if the second gate voltage V2 increases. As a result, the On current of the Si element 1a decreases from $I_{A1}$ to $I_{A3}$, but the On current of the SiC element 1b increases from $I_{B1}$ to $I_{B3}$, establishing $I_T=I_{A3}+I_{B3}$.

As described above, when the On current of the SiC element 1b increases, heat generation of the SiC element 1b increases, which may cause a malfunction in the SiC element 1b. Therefore, the semiconductor device according to Embodiment 5 is configured to conduct protection when the second gate voltage V2 increases as described below.

FIG. 15 is a diagram illustrating a configuration of a semiconductor device according to Embodiment 5, and specifically, a diagram illustrating the configurations of the parallel circuit 1 and the gate drive circuit 2 according to Embodiment 5 in detail. The configuration in FIG. 15 is similar to the configuration in FIG. 9. However, the second comparator 2e2 outputs different output signals to the control circuit 2b depending on whether the second gate voltage V2 is higher than the threshold voltage Vth3 corresponding to a predefined third threshold or lower than the threshold voltage Vth3.

As illustrated in FIG. 16, when the control circuit 2b receives an output signal from the second comparator 2e2 when the second gate voltage V2 is higher than the threshold voltage Vth3, the control circuit 2b turns Off the SiC element 1b regardless of the input signal. Note that in Embodiment 5, while the control circuit 2b turns Off the SiC element 1b, drives the Si element 1a based on the input signal. In this case, the current flowing through the SiC element 1b is to flow through the Si element 1a. However, in line with the current carrying capacity of the Si element 1a being higher than the current carrying capacity of the SiC element 1b, the allowable current of the Si element 1a has more margin than the allowable current of the SiC element 1b; therefore, even if the On current of the Si element 1a becomes somewhat larger, no problem will occur in the Si element 1a.

FIG. 17 is a diagram illustrating another configuration of the semiconductor device according to Embodiment 5. The configuration of FIG. 17 is similar to the configuration in which a voltage reduction circuit 2i is added to the gate drive circuit 2 of the configuration of FIG. 15.

As illustrated in FIG. 18, when the voltage reduction circuit 2i receives an output signal when the second gate voltage V2 is higher than the threshold voltage Vth3 from the second comparator 2e2 via the control circuit 2b, the voltage reduction circuit 2i reduces the second gate voltage V2 to be within a range equal to or higher than the gate threshold of SiC element 1b.

Summary of Embodiment 5

According to the semiconductor device according to Embodiment 5 as described above, when the second gate voltage V2 is higher than the third threshold, the gate drive circuit 2 turns Off the SiC element 1b or reduces the second gate voltage V2. According to such a configuration, the heat generation of the SiC element 1b is suppressed even if the second gate voltage V2 increases; therefore, the malfunction that occurs in the SiC element 1b due to the heat is suppressed. Note that Embodiment 5 may be combined with any of Embodiments 1 to 4.

It should be noted that Embodiments and Modifications can be arbitrarily combined and Embodiments and Modifications can be appropriately modified or omitted.

Hereinafter, the aspects of the present disclosure will be collectively described as Appendices.

Appendix 1

A semiconductor device comprising:
a first semiconductor switching element having a first gate;
a second semiconductor switching element connected in parallel to the first semiconductor switching element, having a second gate, having a band gap larger than that of the first semiconductor switching element and having current carrying capacity lower than that of the first semiconductor switching element; and
a gate drive circuit that drives each of the first semiconductor switching element and the second semiconductor switching element based on an input signal, wherein
when a first gate voltage applied to the first gate to turn On the first semiconductor switching element is lower than a first threshold, the gate drive circuit turns Off the first semiconductor switching element after turns Off the second semiconductor switching element regardless of the input signal.

Appendix 2

The semiconductor device according to Appendix 1, wherein
when a second gate voltage applied to the second gate to turn On the second semiconductor switching element is lower than a second threshold, the gate drive circuit turns Off the second semiconductor switching element regardless of the input signal.

Appendix 3

The semiconductor device according to Appendix 1 or 2, wherein
when the second gate voltage applied to the second gate to turn On the second semiconductor switching element is lower than the second threshold, the gate drive circuit outputs a first abnormal signal to outside.

Appendix 4

The semiconductor device according to Appendix 3, wherein

12 the gate drive circuit outputs the first abnormal signal and a second abnormal signal indicating an abnormality different from the first abnormal signal in mutually distinguishable waveforms from one output terminal to the outside.

Appendix 5

The semiconductor device according to Appendix 1, wherein
when a second gate voltage applied to the second gate to turn On the second semiconductor switching element is higher than a third threshold, the gate drive circuit turns Off the second semiconductor switching element or decreases the second gate voltage.

Appendix 6

The semiconductor device according to any one of Appendices 2 to 4, wherein
when the second gate voltage is higher than a third threshold, the gate drive circuit turns Off the second semiconductor switching element or decreases the second gate voltage.

While the invention has been illustrated and described in detail, the foregoing description is in all aspects illustrative and not restrictive. It is therefore understood that numerous modifications and variations can be devised without departing from the scope of the invention.

What is claimed is:
1. A semiconductor device comprising:
a first semiconductor switching element having a first gate;
a second semiconductor switching element connected in parallel to the first semiconductor switching element, having a second gate, having a band gap larger than that of the first semiconductor switching element and having current carrying capacity lower than that of the first semiconductor switching element; and
a gate drive circuit that drives each of the first semiconductor switching element and the second semiconductor switching element based on an input signal, wherein
when a first gate voltage applied to the first gate to turn On the first semiconductor switching element is lower than a first threshold, the gate drive circuit turns Off the first semiconductor switching element after turns Off the second semiconductor switching element regardless of the input signal.
2. The semiconductor device according to claim 1, wherein
when a second gate voltage applied to the second gate to turn On the second semiconductor switching element is lower than a second threshold, the gate drive circuit turns Off the second semiconductor switching element regardless of the input signal.
3. The semiconductor device according to claim 1, wherein
when the second gate voltage applied to the second gate to turn On the second semiconductor switching element is lower than the second threshold, the gate drive circuit outputs a first abnormal signal to outside.
4. The semiconductor device according to claim 3, wherein
the gate drive circuit outputs the first abnormal signal and a second abnormal signal indicating an abnormality different from the first abnormal signal in mutually distinguishable waveforms from one output terminal to the outside.

5. The semiconductor device according to claim 1, wherein when a second gate voltage applied to the second gate to turn On the second semiconductor switching element is higher than a third threshold, the gate drive circuit turns Off the second semiconductor switching element or decreases the second gate voltage.

6. The semiconductor device according to claim 2, wherein when the second gate voltage is higher than a third threshold, the gate drive circuit turns Off the second semiconductor switching element or decreases the second gate voltage.

7. A semiconductor device comprising:

a first semiconductor switching element having a first gate;

a second semiconductor switching element connected in parallel to the first semiconductor switching element, having a second gate, having a band gap larger than that of the first semiconductor switching element and having current carrying capacity lower than that of the first semiconductor switching element; and a gate drive circuit comprising:

a power supply voltage drop protection circuit that outputs a control signal indicating whether a first gate voltage applied to the first gate to turn On the first semiconductor switching element is lower than a first threshold; and a control circuit that receives the control signal and an input signal for driving each of the first semiconductor switching element and the second semiconductor switching element, and in response to receiving the input signal indicating to switch the first semiconductor switching element and the second semiconductor switching element to an On state and the control signal indicating that the first gate voltage applied to the first gate is lower than a first threshold, the gate drive circuit turns Off the first semiconductor switching element after turning Off the second semiconductor switching element.

8. The semiconductor device according to claim 7, wherein the power supply voltage drop protection circuit outputs a second control signal indicating whether a second gate voltage applied to the second gate to turn On the second semiconductor switching element is lower than a second threshold, and in response to receiving the input signal indicating to switch the first semiconductor switching element and the second semiconductor switching element to the On state and the second control signal indicating that the second gate voltage applied to the second gate is lower than the second threshold, the gate drive circuit turns Off the second semiconductor switching element.

9. The semiconductor device according to claim 7, wherein when a second gate voltage applied to the second gate to turn On the second semiconductor switching element is lower than a second threshold, the gate drive circuit outputs a first abnormal signal to outside.

10. The semiconductor device according to claim 9, wherein the gate drive circuit outputs the first abnormal signal and a second abnormal signal indicating an abnormality different from the first abnormal signal in mutually distinguishable waveforms from one output terminal to the outside.

11. The semiconductor device according to claim 7, wherein when a second gate voltage applied to the second gate to turn On the second semiconductor switching element is higher than a third threshold, the gate drive circuit turns Off the second semiconductor switching element or decreases the second gate voltage.

12. The semiconductor device according to claim 7, wherein the power supply voltage drop protection circuit outputs a second control signal indicating whether a second gate voltage applied to the second gate to turn On the second semiconductor switching element is higher than a third threshold, and in response to receiving the input signal indicating to switch the first semiconductor switching element and the second semiconductor switching element to the On state and the second control signal indicating that the second gate voltage is higher than the third threshold, the gate drive circuit turns Off the second semiconductor switching element or decreases the second gate voltage.

13. A semiconductor device comprising:

a first semiconductor switching element having a first gate;

a second semiconductor switching element connected in parallel to the first semiconductor switching element, having a second gate, having a band gap larger than that of the first semiconductor switching element and having current carrying capacity lower than that of the first semiconductor switching element; and a gate drive circuit that controls to turn On each of the first semiconductor switching element and the second semiconductor switching element based on an input signal indicating to turn On the first semiconductor switching element and the second semiconductor switching element, controls to turn Off each of the first semiconductor switching element and the second semiconductor switching element based on the input signal indicating to turn Off the first semiconductor switching element and the second semiconductor switching element, and when a first gate voltage applied to the first gate to turn On the first semiconductor switching element is lower than a first threshold, controls to turn Off the first semiconductor switching element after turning Off the second semiconductor switching element regardless of the input signal indicating to turn On the first semiconductor switching element and the second semiconductor switching element.

14. The semiconductor device according to claim 13, wherein when a second gate voltage applied to the second gate to turn On the second semiconductor switching element is lower than a second threshold, the gate drive circuit turns Off the second semiconductor switching element regardless of the input signal indicating to turn On the first semiconductor switching element and the second semiconductor switching element.

15. The semiconductor device according to claim 13, wherein when a second gate voltage applied to the second gate to turn On the second semiconductor switching element is lower than a second threshold, the gate drive circuit outputs a first abnormal signal to outside.

16. The semiconductor device according to claim 15, wherein the gate drive circuit outputs the first abnormal signal and a second abnormal signal indicating an abnormality different from the first abnormal signal in mutually 5 distinguishable waveforms from one output terminal to the outside.

17. The semiconductor device according to claim 13, wherein when a second gate voltage applied to the second gate to 10 turn On the second semiconductor switching element is higher than a third threshold, the gate drive circuit turns Off the second semiconductor switching element or decreases the second gate voltage.

18. The semiconductor device according to claim 14, 15 wherein when the second gate voltage is higher than a third threshold, the gate drive circuit turns Off the second semiconductor switching element or decreases the second gate voltage. 20

* * * * *